(12) United States Patent  
Zeng et al.

(10) Patent No.: US 9,231,619 B2  
(45) Date of Patent: Jan. 5, 2016

(54) LDPC DECODER WITH A VARIABLE NODE UPDATER WHICH USES A SCALING CONSTANT

(71) Applicant: SK hynix memory solutions inc., San Jose, CA (US)

(72) Inventors: Lingqi Zeng, Turlock, CA (US); Qiuju Diao, Davis, CA (US); Jason Bellorado, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 58 days.

(21) Appl. No.: 14/083,186

(22) Filed: Nov. 18, 2013

(65) Prior Publication Data

US 2014/0223264 A1    Aug. 7, 2014

Related U.S. Application Data

(60) Provisional application No. 61/760,519, filed on Feb. 4, 2013.

(51) Int. Cl.
*H03M 13/00* (2006.01)
*H03M 13/11* (2006.01)
*H03M 13/37* (2006.01)

(52) U.S. Cl.
CPC ...... *H03M 13/1108* (2013.01); *H03M 13/1111* (2013.01); *H03M 13/1117* (2013.01); *H03M 13/3723* (2013.01); *H03M 13/658* (2013.01)

(58) Field of Classification Search
None
See application file for complete search history.

(56) References Cited

U.S. PATENT DOCUMENTS

| | | | |
|---|---|---|---|
| 2008/0172592 A1* | 7/2008 | Wehn et al. | 714/758 |
| 2008/0282129 A1* | 11/2008 | Blanksby | 714/758 |
| 2008/0301521 A1* | 12/2008 | Gunnam et al. | 714/757 |
| 2010/0122142 A1* | 5/2010 | Sun et al. | 714/752 |
| 2010/0269011 A1* | 10/2010 | Oh et al. | 714/752 |
| 2011/0041033 A1* | 2/2011 | Yedidia et al. | 714/752 |
| 2011/0252294 A1* | 10/2011 | Ng et al. | 714/804 |
| 2012/0221914 A1* | 8/2012 | Morero et al. | 714/752 |
| 2014/0082449 A1* | 3/2014 | Zhang | 714/752 |

* cited by examiner

*Primary Examiner* — Daniel McMahon
(74) *Attorney, Agent, or Firm* — IP & T Group LLP (57) ABSTRACT

A first message, associated with going from one of a plurality of variable nodes to one of a plurality of check nodes is computed, wherein: (1) one or more connections between the plurality of variable nodes and the plurality of check nodes are specified by an LDPC parity check matrix and (2) a scaling constant is used to compute the first message. A second message, associated with going from one of the plurality of check nodes to one of a plurality of variable nodes, is computed, wherein the scaling constant is not used to compute the second message.

13 Claims, 8 Drawing Sheets

LDPC DECODER WITH A VARIABLE NODE UPDATER WHICH USES A SCALING CONSTANT

CROSS REFERENCE TO OTHER APPLICATIONS

This application claims priority to U.S. Provisional Patent Application No. 61/760,519 entitled MODIFIED LDPC DECODER FOR HARD-READ NAND DEVICES filed Feb. 4, 2013 which is incorporated herein by reference for all purposes.

BACKGROUND OF THE INVENTION

Low-density parity-check (LDPC) codes are used to write to and read from solid state storage, which (in turn) are used in mobile devices. Naturally, since mobile devices operate off of a battery, power consumption is an important issue for all components, including LDPC decoders.

A straightforward way to save power is to reduce the number of bits used to represent the soft information which is input by the LDPC decoder. This translates directly into a reduction in the number of operations which in turn reduces power consumption. Unfortunately, simply reducing the number of bits can cause significant performance degradation (e.g., because of numerical errors, rounding errors, and/or saturation errors). New LDPC decoding techniques which have reduced performance degradation (particularly in systems where the number of bits used to represent soft information is relatively small) would be desirable. This would, for example, enable power to be conserved without sacrificing too much performance.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
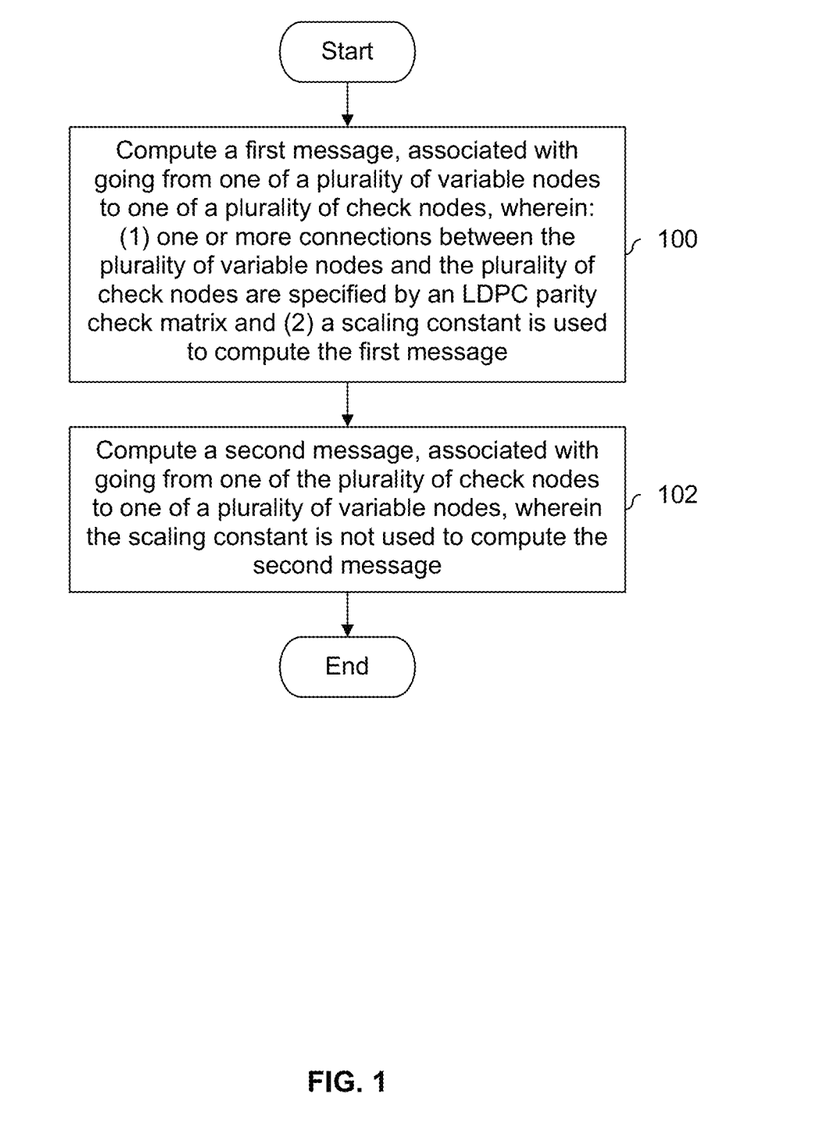
FIG. 1 is a flowchart illustrating an embodiment of a message updating process used by a low-density parity-check (LDPC) decoding process.

FIG. 1 is a flowchart illustrating an embodiment of a message updating process used by a low-density parity-check (LDPC) decoding process. In the example shown, the process is performed by one or more components in an LDPC decoder. In some embodiments, the message updating process shown is performed by one or more components in a communications system. In some embodiments, the message updating process shown is performed by one or more components in a storage system (e.g., a solid state storage system, a NAND Flash storage system, and/or a 3D NAND storage system).

At 100, a first message, associated with going from one of a plurality of variable nodes to one of a plurality of check nodes, is computed wherein: (1) one or more connections between the plurality of variable nodes and the plurality of check nodes are specified by an LDPC parity check matrix and (2) a scaling constant is used to compute the first message. For example, if the first message is passed from a $j^{th}$ variable node to an $i^{th}$ check node, then the first message may be referred to as $Q_{ji}$.

At 102, a second message, associated with going from one of the plurality of check nodes to one of a plurality of variable nodes, is computed wherein the scaling constant is not used to compute the second message. For example, if the second message is passed from an $i^{th}$ check node to a $j^{th}$ variable node, then the second message may be referred to as $R_{ij}$.

Note that the check node and the variable node that are associated with the second message are not necessarily the same check node and/or the same variable node that are associated with the first message. For example, the first message generated at step 100 may be from a first variable node to a second check node (e.g., $Q_{12}$) and the second message generated at step 102 may be from a third check node to a fourth variable node (e.g., $R_{34}$). Depending upon the particular parity check matrix (H) used, different check nodes will be connected to different variable nodes. If the parity check matrix has N columns and M rows, then N(m) is the set of variable nodes connected to the check node m and N(m)/n is the set of variable nodes connected to the check node m, except for variable node n. In other words, N(m)/n is the set N(m) with the element n removed. Similarly, M(n) is the set of check nodes connected to the variable node n and M(n)/m is the set of check nodes connected to the variable node n, except for check node m.

Figure 2:
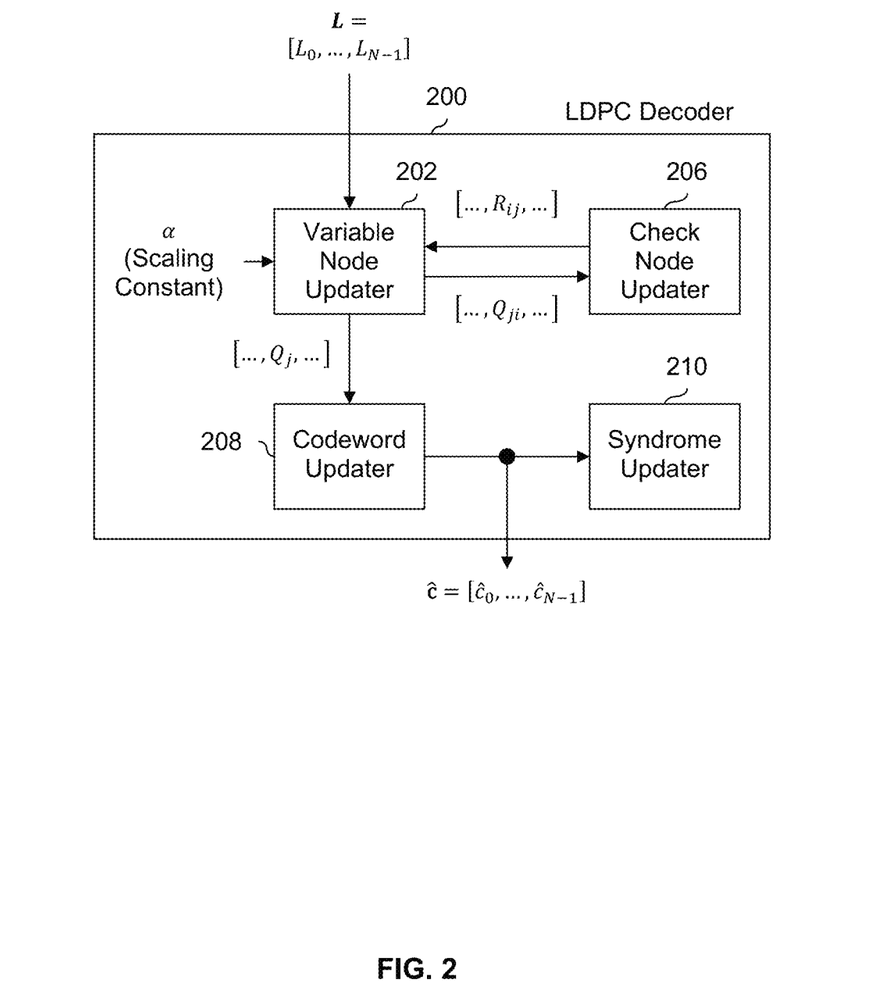
FIG. 2 is a diagram illustrating an embodiment of an LDPC decoder with a variable node updater which uses a scaling constant.

The following figure shows an example of an LDPC decoder, including components which perform steps 100 and 102 from FIG. 1.

FIG. 2 is a diagram illustrating an embodiment of an LDPC decoder with a variable node updater which uses a scaling constant. In some embodiments, LDPC decoder 200 is implemented using a semiconductor device, such as a field-programmable gate array (FPGA) or an application-specific integrated circuit (ASIC).

In the example shown, LDPC decoder 200 includes variable node updater 202 which generates a message ($Q_{ji}$) which is associated with being sent from variable node j to check node i. For convenience, such a message may be referred to herein as "a message which is sent from variable node j to check node i." Variable node updater 202 is one example of a component which performs step 100 in FIG. 1.

With respect to the scaling constant ($\alpha$), note that the scaling constant is input to variable node updater 202, but is not input to check node updater 206. In other words, variable node updater 202 calculates the message $Q_{ji}$ based on and/or using scaling constant, while check node updater 206 does not take the scaling constant into account in its calculations (e.g., for $R_{ij}$). A more detailed description of the computation performed by variable node updater 202 in order to generate the message $Q_{ji}$ is described in further detail below.

Check node updater 206 shows one example of a component which performs step 102 in FIG. 1. For example, the message $R_{ij}$ which is output by check node updater 206 is an example of a second message which is generated at step 102 in FIG. 1. As above, a message, associated with being sent from check node i to variable node j, is referred to herein as "a message sent from check node i to variable node j" for convenience. A more detailed description of the computation performed by check node updater 206 in order to generate the message $R_{ij}$ is described in further detail below.

In the exemplary LDPC decoder shown, an array or sequence of N log-likelihood ratio (LLR) values (i.e., $L=[L_0, \ldots, L_{N-1}]$) is input by LDPC decoder 200. For example, LDPC decoder 200 may be used in a storage system and a page or segment containing N cells is read from storage. Each of the LLR values is a soft value where the sign indicates a decision (e.g., a negative sign indicates a 1 and a positive sign indicates a 0) and the magnitude indicates the certainty or likelihood associated with that decision (e.g., a larger magnitude corresponds to more certainty in an associated decision). In the example shown, a fixed number of bits (w) is used to represent each LLR value which is input by LDPC decoder 200. For example, if w=3, then each $L_j$ value is represented using 3 bits.

$Q_{ji}$ messages (sent from the $j^{th}$ variable node to the $i^{th}$ check node) may be calculated using the following equation:

$$Q_{ji} = L_j + \alpha \left( \sum_{i' \in M(j)/i} R_{i'j} \right) \quad \text{Equation 1}$$

for $0 \leq j \leq N-1$ and $i \in M(j)$.

Note that Equation (1) is merely one representation of a message calculation performed by a variable node updater. For example, Equation (1) may be rewritten as:

$$Q_{ji} = \alpha \left( \frac{L_j}{\alpha} + \sum_{i' \in M(j)/i} R_{i'j} \right) \quad \text{Equation 2}$$

similarly for $0 \leq j \leq N-1$ and $i \in M(j)$.

Equation (2) may be further simplified for certain cases. For example, in some cases, the magnitude of all of the N LLR values is the same and only the sign varies (e.g., from cell to cell being read). For example, in a storage system, if only one read of the page or segment has been performed, then the system will have $L_j$ values which have the same magnitude (e.g., $L_j=-2$ for cells storing a voltage less than the read threshold, or $L_j=2$ for cells storing a voltage greater than the read threshold). The magnitudes (in that example, 2) are the same and only the sign is different. In such cases, the magnitude of $L_j/\alpha$ (e.g., in Equation (2) may be calculated ahead of time and only the sign needs to be determined "on the fly." If Z(0/1) is used to represent the (pre-calculated) magnitude of $L_j/\alpha$ and "±" is used to indicate the appropriate sign (whatever it is for that particular cell), then Equation (2) may be rewritten as:

$$Q_{ji} = \alpha \left( \pm Z(0/1) + \sum_{i' \in M(j)/i} R_{i'j} \right) \quad \text{Equation 3}$$

similarly for $0 \leq j \leq N-1$ and $i \in M(j)$.

In many cases (e.g., approximately 98% of the time), an LDPC decoder requires only one read of the page in order to successfully decode the desired segment or page. By using Z(0/1), a smaller memory can be accessed and therefore power can be saved. And, of course, Z(0/1) is a simpler operation than $L_j/\alpha$.

Figure 3:
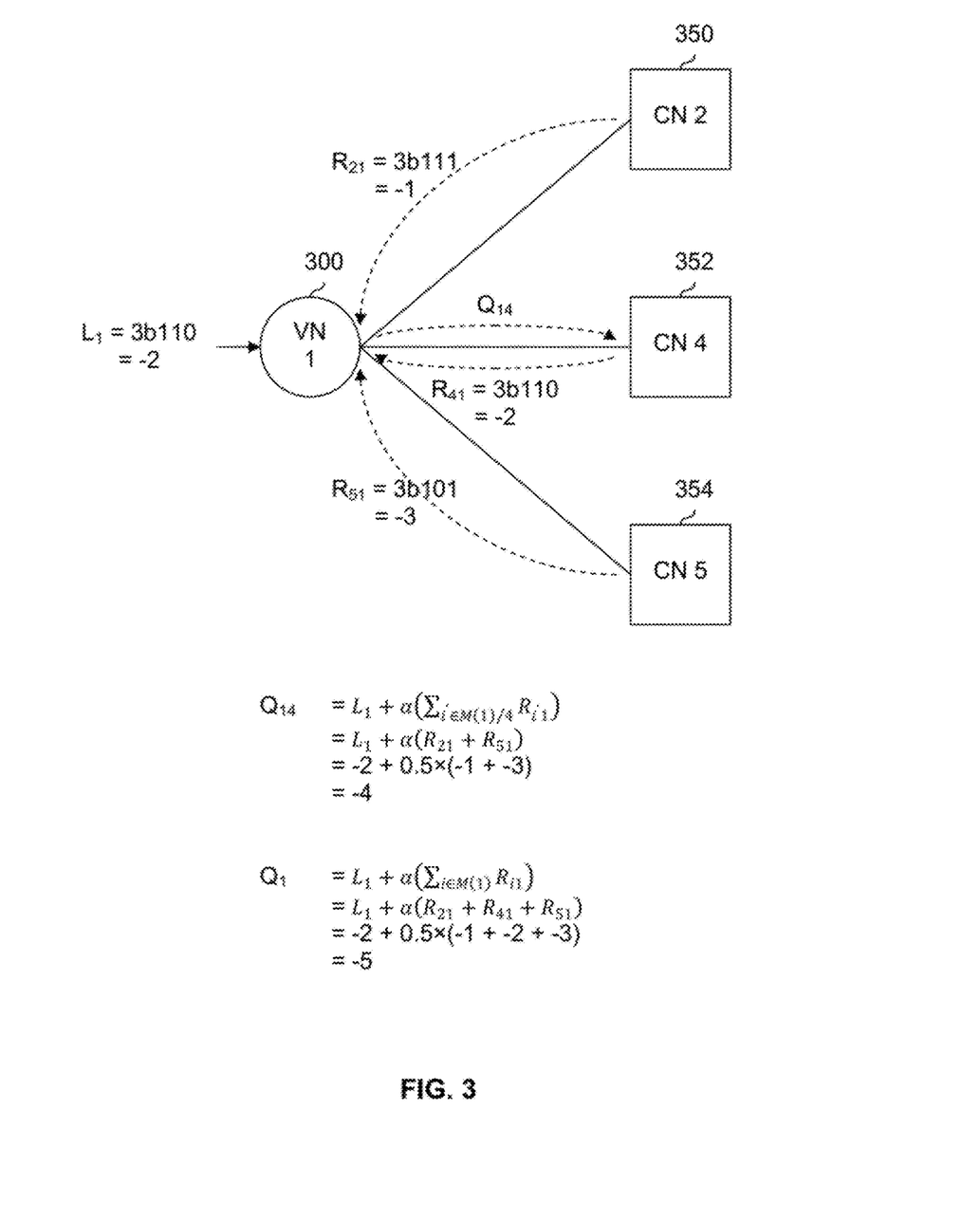
FIG. 3 is a diagram illustrating a numerical example of calculation of a message sent from a variable node to a check node.

The following figure shows a numerical example of the calculation of one $Q_{ji}$ value using Equation (1).

FIG. 3 is a diagram illustrating a numerical example of calculation of a message sent from a variable node to a check node. In some embodiments, the process is performed by variable node updater 202 in FIG. 2. In this example, w=3 (i.e., three bits are used to represent each LLR value input to the LDPC decoder) and check nodes 350, 352, and 354 are connected to variable node 300 (e.g., where the connections are specified by the parity check matrix, H).

In the example shown, the message $Q_{14}$ from a first variable node (300) to a fourth check node (352) is being calculated. The relevant LLR value in this example is $L_1$, which in this example is 3b110, which in two's complement is -2 in decimal form. Note that the prefix "3b" indicates that three bits are used to represent the number in binary form. Naturally, although two's complement representations are shown herein, any signed representation may be used.

Looking at the latter portion of Equation (1), that summation is performed over the set M(j)/i. For the example shown in FIG. 3, the set M(j) comprises the second check node (350), the fourth check node (352), and the fifth check node (354) and the set M(j)/i comprises the second check node (350) and the fifth check node (354).

With the set M(j)/i resolved, the summation in Equation (1) simplifies to $(R_{21}+R_{51})$. As such, $Q_{14}=L_1+\alpha(\Sigma_{i' \in M(1)/4} R_{i'1})=L_1+\alpha(R_{21}+R_{51})$. If the scaling factor $\alpha=0.5$, then $Q_{14}=-2+0.5\times(-1+-3)=-4$.

Returning to FIG. 2, in addition to generating $Q_{ji}$ messages, variable node updater 202 generates $Q_j$ for $0 \le j \le N-1$. $Q_j$ may be referred to herein as a decoded LLR. These values are passed from variable node updater 202 to codeword updater 208. In this example, variable node updater 202 uses the following equation to calculate $Q_j$:

$$Q_j = \frac{L_j}{\alpha} + \sum_{i \in M(j)} R_{ij} \qquad \text{Equation 4}$$

for $0 \le j \le N-1$. As before, if the magnitudes of all LLR values are the same and only the sign differs (e.g., as is the case after one read of solid state storage), then Equation (4) may be rewritten as:

$$Q_j = \pm Z(0/1) + \sum_{i \in M(j)} R_{ij} \qquad \text{Equation 5}$$

for $0 \le j \le N-1$.

In some embodiments, $Z(0/1)$ is pre-calculated and variable node updater 202 includes some storage or memory (not shown in FIG. 2) in which the pre-calculated value of $Z(0/1)$ is stored. For example, $Z(0/1)$ may be stored in a register which is set by firmware. When $Q_{ji}$ or $Q_j$ is calculated and it is appropriate to use $Z(0/1)$, then the stored value is obtained from storage.

Returning to FIG. 3, a numerical example of $Q_j$ being calculated is shown. In that example, the set M(j) comprises check nodes 350, 352, and 354 and so for the exemplary values shown, $Q_1 = L_1 + \alpha(\Sigma_{i \in M(1)} R_{i1}) = L_1 + \alpha(R_{21} + R_{41} + R_{51}) = -2 + 0.5 \times (-1 + -2 + -3) = -5$.

$R_{ij}$ messages (sent from an $i^{th}$ check node to a $j^{th}$ variable node) are calculated using the following equation:

$$R_{ij} = \left( \prod_{j' \in N(i)/j} \text{sign}(Q_{j'i}) \right) \min_{j' \in N(i)/j} |Q_{j'i}| \qquad \text{Equation 6}$$

for $0 \le i \le M-1$ and $j \in N(i)$.

Figure 4:
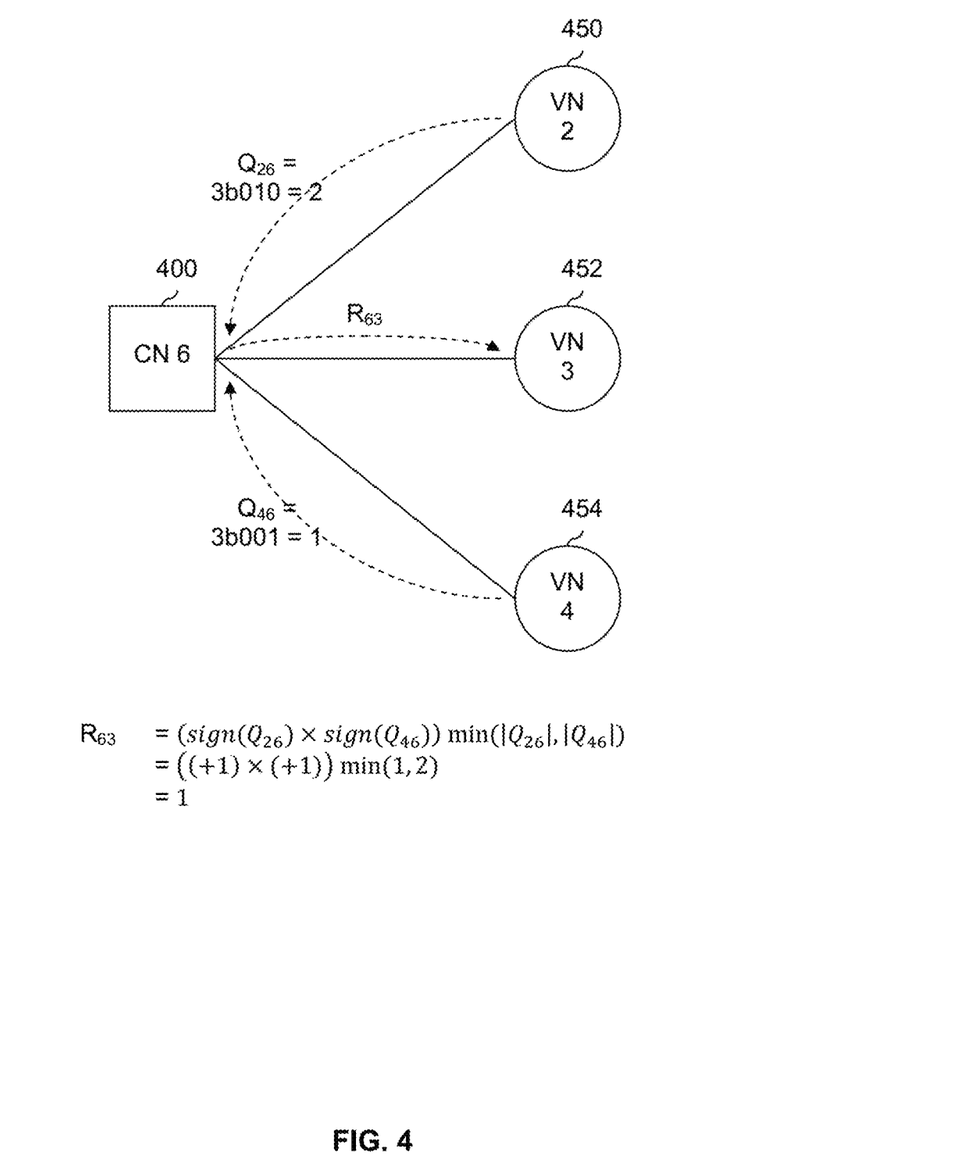
FIG. 4 is a diagram illustrating a numerical example of calculation of a message sent from a check node to a variable node.

The first part of Equation (6) (i.e., $\Pi_{j' \in N(i)/j} \text{sign}(Q_{j'i})$) produces either +1 or −1. The second part of Equation (6) (i.e., $\min_{j' \in N(i)/j} |Q_{j'i}|$) produces a positive value. In other words, the first part of Equation (6) determines the sign and second part of Equation (6) determines the magnitude. The following figure shows a numerical example of one $R_{ij}$ value being calculated.

FIG. 4 is a diagram illustrating a numerical example of calculation of a message sent from a check node to a variable node. In the example shown, the message $R_{63}$ from a sixth check node (400) to a third variable node (452) is being calculated and check node 400 is connected to variable nodes 450, 452, and 454. As in the previous example, w=3. The scaling constant (i.e., $\alpha$) is not used in calculating $R_{ij}$, so it is not necessary to specify an exemplary numerical value in this example.

In Equation (6), the summation and the minimum operation both operate over the set N(i)/j. For the example shown here, the set N(i) comprises the second variable node (450), the third variable node (452), and the fourth variable node (454) and the set N(i)/j comprises the second variable node (450) and the fourth variable node (454).

With the set N(i)/j resolved, Equation (6) may be reduced to $R_{63} = (\text{sign}(Q_{26}) \times \text{sign}(Q_{46})) \min(|Q_{26}|, |Q_{46}|)$. This in turn reduces to $R_{63} = ((+1) \times (+1)) \min(1, 2) = 1$.

Returning to FIG. 2, codeword updater 208 calculates (for $0 \le j \le N-1$) $\hat{c} = [\hat{c}_0, \hat{c}_1, \ldots, \hat{c}_{N-1}]$ using the following:

$$\hat{c}_j = \begin{cases} 0 & \text{if } Q_j \ge 0 \\ 1 & \text{if } Q_j < 0 \end{cases} \qquad \text{Equation 7}$$

In some embodiments, the MSB bits of the decoded LLR values (i.e., $Q_j$) comprise the decoded sequence (i.e., $\hat{c} = [\hat{c}_0, \hat{c}_1, \ldots \hat{c}_{N-1}]$), so the MSB bits of the decoded LLR values are sent to syndrome updater 210 to decide whether decoding is successful or not. In other words, in some embodiments, codeword updater 208 performs relatively simple processing.

Syndrome updater 210 checks to see if all of the errors have been removed from the codeword. If $\hat{c}H=0$, then syndrome updater 210 determines that decoding is successful and all errors have been removed from the codeword. If so, LDPC decoder 200 stops decoding and outputs $\hat{c} = [\hat{c}_0, \hat{c}_1, \ldots \hat{c}_{N-1}]$ as the decoder output.

If $\hat{c}H \ne 0$, the codeword (i.e., $\hat{c}$) is not output and another decoding iteration is performed (e.g., variable node updater 202 calculates new $Q_{ji}$ messages and new $Q_j$ values, check node updater 206 calculates new $R_{ij}$ messages, and codeword updater 208 calculates a new codeword and checks if the product of the new codeword and the parity check matrix is 0), or until some (e.g., predefined) maximum number of iterations is reached.

The following is an example of a three-step LDPC decoding process which uses the message updating techniques described above, where the effects of quantization (i.e., w is a fixed, non-infinite number) is explicitly accounted for. Note that the following examples assume that the magnitudes of all LLR values are the same, and so $\pm Z(0/1)$ is used in place of $L_j/\alpha$. Naturally, if that condition is not satisfied, then $L_j/\alpha$ may be used in place of $\pm Z(0/1)$.

Step 1 (Variable Node Update)

For $0 \le j \le N-1$ and $i \in M(j)$, compute:

$$Q_{ji} = \text{sat}\left(\text{round}\left(\alpha\left(\pm Z(0/1) + \sum_{i' \in M(j)/i} R_{i'j}\right)\right)\right) \qquad \text{Equation 8}$$

and for $0 \le j \le N-1$, compute:

$$Q_j = \pm Z(0/1) + \sum_{i \in M(j)} R_{ij} \qquad \text{Equation 9}$$

Step 2 (Check Node Update)

For $0 \le i \le M-1$ and $j \in N(i)$, compute:

$$R_{ij} = \left( \prod_{j' \in N(i)/j} \text{sign}(Q_{j'i}) \right) \min_{j' \in N(i)/j} |Q_{j'i}| \qquad \text{Equation 10}$$

Step 3 (Decision)

For $0 \leq j \leq N-1$, compute $\hat{c} = [\hat{c}_0, \ldots, \hat{c}_{N-1}]$ where:

$$\hat{c}_j = \begin{cases} 0 & \text{if } Q_j \geq 0 \\ 1 & \text{if } Q_j < 0 \end{cases} \quad \text{Equation 11}$$

where if $\hat{c}H=0$ (i.e., decoding is successful) decoding stops and the codeword (i.e., $\hat{c}$) is output as the LDPC decoder output. If the product of the codeword (i.e., $\hat{c}$) and the parity check matrix (i.e., H) is non-zero, then the process returns to Step 1 until some maximum number of iterations is reached or until decoding is successful.

Figure 5:
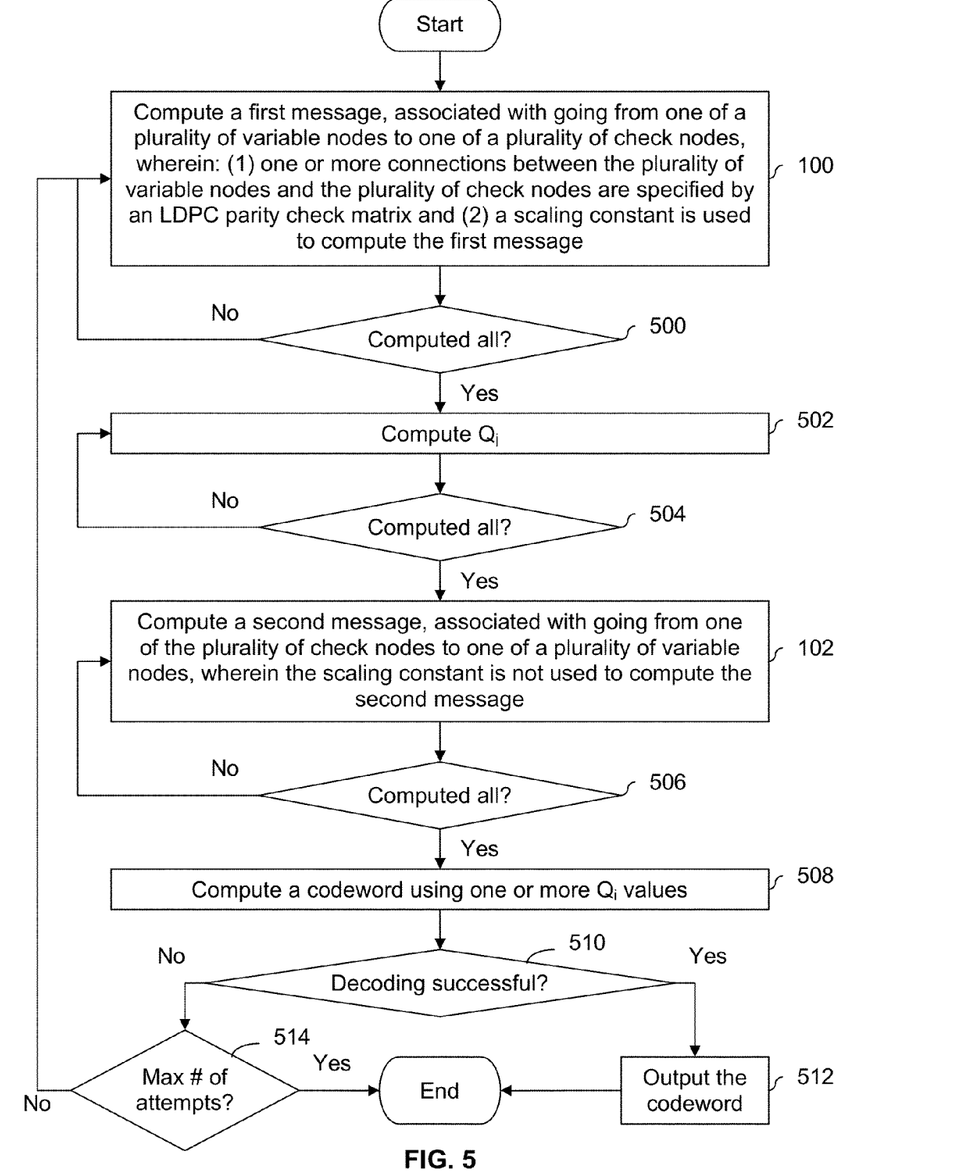
FIG. 5 is a flowchart illustrating an embodiment of an LDPC decoding process where messages, updated during a variable node update state, are updated using a scaling constant.

FIG. 5 is a flowchart illustrating an embodiment of an LDPC decoding process where messages, updated during a variable node update state, are updated using a scaling constant. In the example shown, the message updating process of FIG. 1 is incorporated into an LDPC decoding process in order to illustrate how that message updating process may be used. For convenience, the steps shown in FIG. 1 are shown in FIG. 5 with the same numbering.

At 100, a first message, associated with going from one of a plurality of variable nodes to one of a plurality of check nodes, is computed wherein: (1) one or more connections between the plurality of variable nodes and the plurality of check nodes are specified by an LDPC parity check matrix and (2) a scaling constant is used to compute the first message.

At 500, it is determined if all first messages have been computed. For example, step 100 is performed for $0 \leq j \leq N-1$ and $i \in M(j)$. If step 100 has been performed for all combinations of i and j, then the decision at 500 is "Yes." If it is determined at 500 that more first messages remain to be computed, then step 100 is repeated.

After computing all first messages, $Q_j$ is computed at step 502. In the example of FIG. 2, variable node updater 202 may perform this step. At 504, it is determined if all $Q_j$ values have been computed. For example, if $Q_j$ has not yet been calculated for all $0 \leq j \leq N-1$ then step 502 is repeated.

After all $Q_j$ values are computed, at 102, a second message, associated with going from one of the plurality of check nodes to one of a plurality of variable nodes, is computed wherein the scaling constant is not used to compute the second message. At 506, it is determined if all second messages have been computed. For example, if $R_{ij}$ values have not yet been calculated for all combinations of $0 \leq i \leq M-1$ and $j \in N(i)$ then step 102 is repeated.

After all second messages are computed, at 508, a codeword is computed using one or more $Q_j$ values. In FIG. 2, for example, step 508 may be performed by codeword updater 208 which generates $\hat{c} = [\hat{c}_0, \hat{c}_1, \ldots \hat{c}_{N-1}]$.

At 510, it is determined if decoding is successful. For example, codeword updater 208 in FIG. 2 may determine if $\hat{c}H=0$. If so, the process concludes that decoding is successful (i.e., no errors remain in the codeword) and the codeword is output at 512. If $\hat{c}H$ is a non-zero value, then the process concludes that decoding is not successful (i.e., some errors remain in the codeword).

If decoding is determined to be successful at 510, then the codeword is output at 512. If decoding is not determined to be successful at 510, then it is determined at 514 if a maximum number of attempts has been reached. For example, an LDPC decoder may stop trying to decode a page or segment if some maximum number of decoding attempts is reached (e.g., preventing an infinite loop situation from occurring). If the maximum number of attempts has not been reached, then a new first message is calculated at 100. If the maximum number of attempts has been reached, then the process ends (e.g., and a read failure or a decoding failure signal is sent to an appropriate component or entity).

FIG. 5 shows one type of decoding scheduling called flooding scheduling. The techniques described herein are not limited to flooding scheduling and may be used with other types of decoding scheduling. For example, other types of decoding scheduling (i.e., non-flooding scheduling) do not do a "Compute All?" check at step 500 and/or step 504. FIG. 5 is merely exemplary and is not intended to be limiting.

Figure 6:
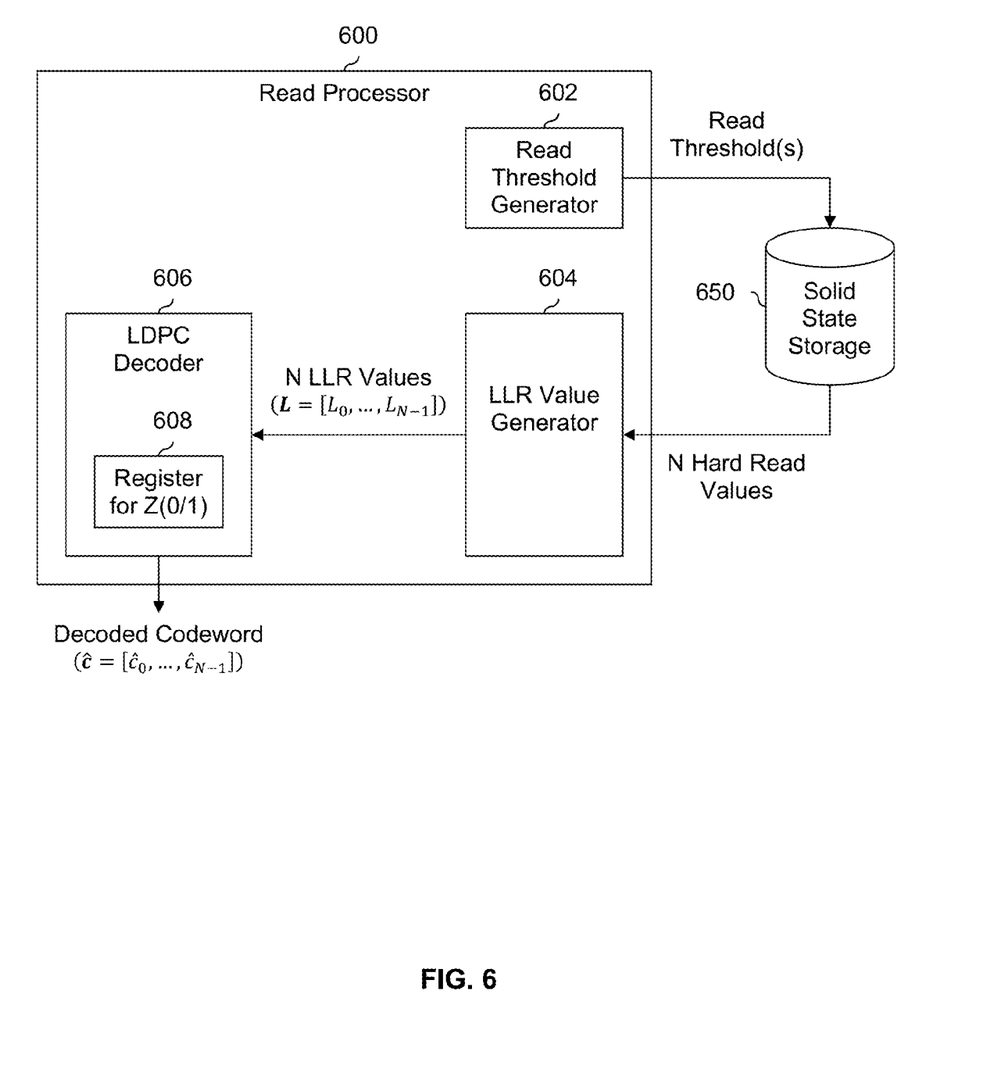
FIG. 6 is a diagram illustrating an embodiment of a storage system, including an LDPC decoder with a variable node updater which uses a scaling constant.

FIG. 6 is a diagram illustrating an embodiment of a storage system, including an LDPC decoder with a variable node updater which uses a scaling constant. FIG. 6 shows one example of how LDPC decoder 200 from FIG. 2 may be incorporated into a storage system. For brevity, a write processor corresponding to read processor 600 is not shown. Naturally, this is not intended to be limiting and the techniques described herein may be used in a system with a co-located write processor.

Read processor 600 includes read threshold generator 602 which generates one or more read thresholds which are used to read solid state storage 650. In various embodiments, solid state storage 650 may include NAND Flash or 3D NAND. The read threshold(s) output by read threshold generator 602 is used to read a group of N cells (e.g., a page, a segment, etc.) in solid state storage 650.

Initially, only one read of solid state storage 650 is performed (e.g., a desired page or segment containing N cells is read). N hard read values corresponding to those N cells are passed from solid state storage 650 to LLR value generator 604. For example, if solid state storage 650 includes single-level cells (SLC), then each of the hard read values may be either a 1 or a 0. In various other embodiments, solid state storage 650 includes multi-level cells (MLC) where two bits are stored per cell, tri-level cells (TLC) where three bits per cell are stored, and so on.

LLR value generator 604 generates N LLRs using the N hard read values. Since (initially) only one read of the group of N cells has been performed, all of the N LLR values (i.e., $L=[L_0, \ldots, L_{N-1}]$) which are passed from LLR value generator 604 to LDPC decoder 606 have the same magnitude. LDPC decoder 606 (or a variable node updater within it) knows that all of the LLR magnitudes are the same (e.g., because it has been counting decoding attempts or tracking when decoding of a new segment or page begins) and is able to use the stored Z(0/1) value stored in register 608. For example, register 608 may be programmed with the appropriate value by firmware. Selection of the sign to use with each stored value of Z(0/1) (e.g., in the equation $Q_j = \pm Z(0/1) + \Sigma_{i \in M(j)} R_{ij}$, the sign in front of the Z(0/1) term needs to be selected or determined) may be determine using the sign of the LLR values input to LDPC decoder 606.

If decoding is successful at LDPC decoder 606, then the decoded codeword is output. If, however, decoding at LDPC decoder 606 is unsuccessful (e.g., after some number of maximum decoding attempts is reached) then another read of solid state storage 650 is performed. For example, read threshold generator 602 generates a second set of one or more read thresholds in order to read the desired page or segment. A second set of N hard read values is passed to LLR value generator 604 from solid state storage 650.

With two sets of N hard read values available to it, LLR value generator 604 generates a second set of N LLR values. Unlike the first set of N LLR values, the LLR values in the second set will not all have the same magnitude. For example, after the second read, LLR value generator 604 assigns each of the N cells into one of three bins. Cells assigned to the leftmost bin and the rightmost bin will have the same LLR magnitude (but different signs), but cells assigned to the middle bin will have different LLR magnitudes than cells assigned to the other two bins. As such, after the second read, LDPC decoder 606 (or a variable node updater within it) cannot use the stored value of Z(0/1) stored in register 608 when calculating $Q_{ji}$ and/or $Q_j$.

If two reads of the group of N cells has been performed (e.g., using two or more sets of read threshold(s)) then those two sets of N hard read values is used in generating the N LLR values. Any appropriate LLR value generation technique may be used and the techniques described herein are independent of the particular LLR value generation technique used.

The N LLR values are passed from LLR value generator 604 to LDPC decoder 606 which includes a variable node updater that uses a scaling constant (see, e.g., LDPC decoder 200 in FIG. 2). LDPC decoder 606 processes the N LLR values as described above and outputs a decoded codeword of length N (i.e., $\hat{c}=[\hat{c}_0, \ldots, \hat{c}_{N-1}]$) once it has determined that all errors have been removed from the codeword. If needed, additional reads of solid state storage 650 are performed (e.g., using a new set of read threshold(s)) so that a new set of N hard read values and a new set of N LLR values may be generated for another decoding attempt by LDPC decoder 606. In some embodiments, decoding attempts end in the event a maximum number of decoding attempts is reached.

Figure 7:
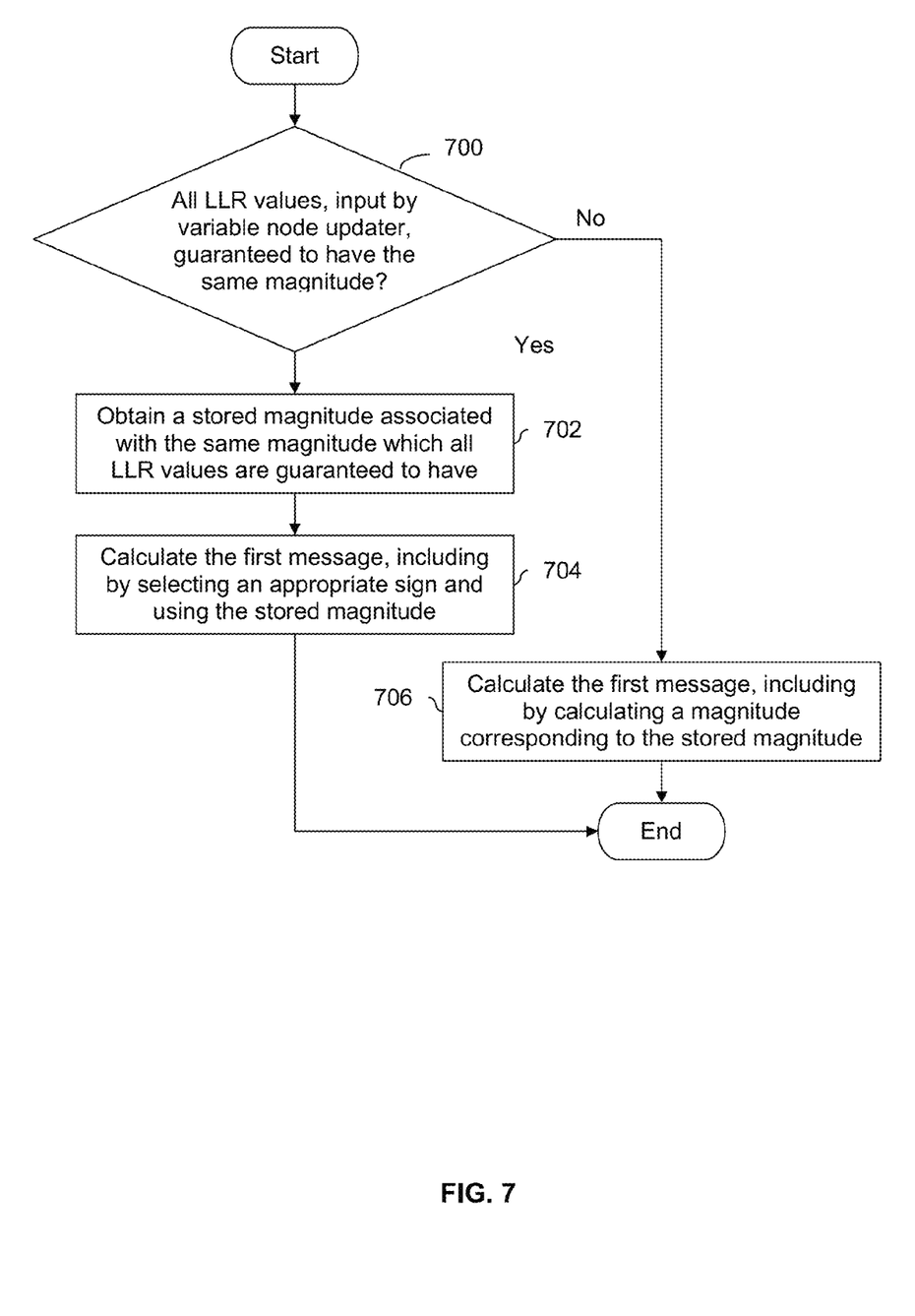
FIG. 7 is a flowchart illustrating an embodiment of a process to determine values used in calculating a first message (e.g., $Q_{ji}$) and/or $Q_j$.

FIG. 7 is a flowchart illustrating an embodiment of a process to determine values used in calculating a first message (e.g., $Q_{ji}$) and/or $Q_j$. In some embodiments, the example process shown is used in step 100 in FIG. 1 and/or FIG. 5. At 700, it is determined if all LLR values, input by variable node updater, are guaranteed to have the same magnitude. For example, as described above, in some storage systems it is guaranteed that all LLR values will have the same magnitude if only one read of the desired page or segment has been performed. An LDPC decoder or variable node updater may track this in a variety of ways (e.g., the LDPC decoder is notified by firmware whether the decoding is using hard read values or soft read values).

If it is determined at 700 that all LLR values are guaranteed to have the same magnitude, then at 702, a stored magnitude, associated with the same magnitude which all LLR values are guaranteed to have, is obtained at 702. For example, firmware may store a value for Z(0/1) (i.e., the magnitude of $L_j/\alpha$) in register 608 in FIG. 6 and the value stored therein is obtained at step 702. At 704, the first message calculated, including by selecting an appropriate sign and using the stored magnitude. For example, in two's complement, if the most significant bit (MSB) is a 1, then the sign is negative. If the MSB is 0, then the sign is positive. Using Equation (9) as an example, if (for that value of j), the MSB of $L_j$ is 1, then a negative sign is selected (e.g., for the sign of the $\pm Z(0/1)$ term).

If, however, it is determined at 700 that all LLR values are not guaranteed to have the same magnitude (e.g., because two or more reads have been performed and it cannot be guaranteed that all LLR values will have the same magnitude) then at 706, the first message is calculated, including by calculating a magnitude corresponding to the stored magnitude. For example, $L_j/\alpha$ may be calculated on-the-fly. In some embodiments, $L_j/\alpha$ is calculated once (e.g., on-the-fly) for each unique value of $L_j$ and is stored thereafter for future use at step 706. If the same value of $L_j$ is observed later, then the stored value is used. Performing a division may be computationally intensive and/or expensive and this reduces the number of divisions which are performed.

Figure 8:
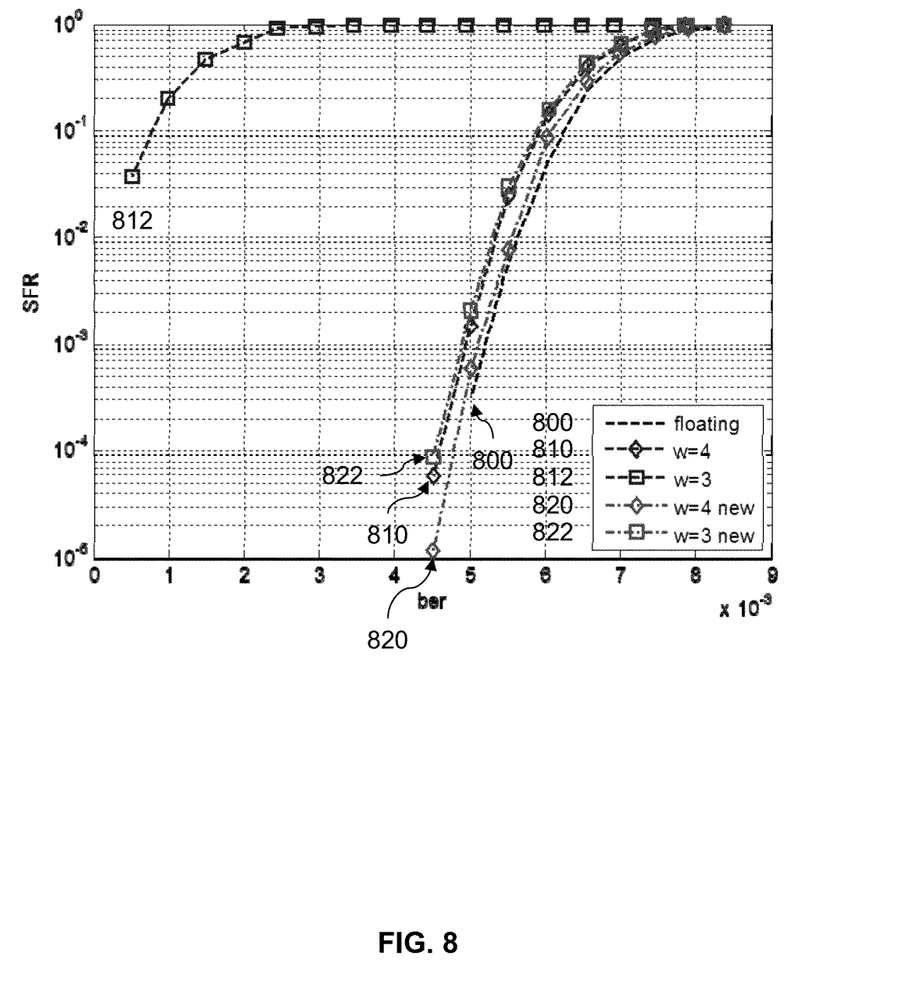
FIG. 8 is a graph illustrating an embodiment of the performance improvement offered by the techniques described herein.

FIG. 8 is a graph illustrating an embodiment of the performance improvement offered by the techniques described herein. In this graph, performance plots for various values of w (i.e., the number of numbers of bits used to represent the soft information input by an LDPC decoder) are shown. Plot 800 (dashed line) shows the performance associated with a floating point representation (i.e., when an infinite number of bits is available to represent the soft information).

Plots 810 and 812 are associated with an LDPC decoder where the scaling constant is used and/or accounted for by a check node updater. Plot 810 (dashed line with diamonds) shows the performance of the other LDPC decoder when four bits are used to represent the soft information and plot 812 (dashed line with squares) shows the performance for that other system when three bits are used to represent the soft information.

Plot 820 (dashed and dotted line with diamonds) and plot 822 (dashed and dotted line with squares) are associated with an LDPC decoder where the scaling constant is used and/or accounted for by a variable node updater. Plot 820 shows the performance with w=4 and plot 822 shows the performance with w=3. Notice that the performance of plot 820 is better than that of plot 810 where both are limited to w=4. The improvement in performance between plot 822 and plot 812 (where both are limited to w=3) is especially striking. A w=3 is within the range of a real world design choice and so the performance improvement offered by the techniques described herein would be noticeable in real world systems.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a hardware variable node updater configured to compute a first message, associated with going from one of a plurality of variable nodes to one of a plurality of check nodes wherein:
one or more connections between the plurality of variable nodes and the plurality of check nodes are specified by an LDPC parity check matrix;
a scaling constant is used to compute the first message; and
computing the first message includes:
determining if all log-likelihood ratio (LLR) values, used in computing the first message, are guaranteed to have the same magnitude;
in the event it is determined that said all LLR values are guaranteed to have the same magnitude:
obtaining a stored magnitude associated with the same magnitude which said all LLR values are guaranteed to have; and
calculating the first message, including by selecting an appropriate sign and using the stored magnitude; and
a hardware check node updater configured to compute a second message, associated with going from one of the plurality of check nodes to one of the plurality of variable nodes, wherein the scaling constant is not used to compute the second message.

2. The system of claim 1, wherein the system is implemented using a semiconductor device, including one or more of the following: a field-programmable gate array (FPGA) or an application-specific integrated circuit (ASIC).

3. The system of claim 1, wherein the system is included in one or more of the following: a communications system, a solid state storage system, a NAND Flash storage system, or a 3D NAND storage system.

4. The system of claim 1 further comprising:
a codeword updater configured to compute a codeword; and
a syndrome updater configured to determine if decoding is successful based at least in part on the codeword and a parity check matrix, wherein in the event it is determined that decoding is successful, the codeword is output.

5. The system of claim 1 further comprising:
a read threshold generator configured to generate one or more read thresholds associated with reading solid state storage; and
a log-likelihood ratio (LLR) value generator configured to generate a plurality of LLR values, wherein the variable node updater is further configured to compute the first message based on at least one of the plurality of LLR values.

6. A method, comprising:
using a processor to compute a first message, associated with going from one of a plurality of variable nodes to one of a plurality of check nodes, wherein:
one or more connections between the plurality of variable nodes and the plurality of check nodes are specified by an LDPC parity check matrix;
a scaling constant is used to compute the first message; and
computing the first message includes:
determining if all log-likelihood ratio (LLR) values, used in computing the first message, are guaranteed to have the same magnitude; and
in the event it is determined that said all LLR values are guaranteed to have the same magnitude:
obtaining a stored magnitude associated with the same magnitude which said all LLR values are guaranteed to have; and
calculating the first message, including by selecting an appropriate sign and using the stored magnitude; and
using the processor to compute a second message, associated with going from one of the plurality of check nodes to one of the plurality of variable nodes, wherein the scaling constant is not used to compute the second message.

7. The method of claim 6, wherein the method is performed using a semiconductor device, including one or more of the following: a field-programmable gate array (FPGA) or an application-specific integrated circuit (ASIC).

8. The method of claim 6, wherein the method is performed by one or more of the following: a communications system, a solid state storage system, a NAND Flash storage system, or a 3D NAND storage system.

9. The method of claim 6 further comprising:
computing a codeword; and
determining if decoding is successful based at least in part on the codeword and a parity check matrix, wherein in the event it is determined that decoding is successful, the codeword is output.

10. The method of claim 6 further comprising:
generating one or more read thresholds associated with reading solid state storage; and
generating a plurality of log-likelihood ratio (LLR) values, wherein the processor is further configured to compute the first message based on at least one of the plurality of LLR values.

11. A computer program product, the computer program product being embodied in a non-transitory computer readable storage medium and comprising computer instructions for:
computing a first message, associated with going from one of a plurality of variable nodes to one of a plurality of check nodes, wherein:
one or more connections between the plurality of variable nodes and the plurality of check nodes are specified by an LDPC parity check matrix;
a scaling constant is used to compute the first message; and
computing the first message includes:
determining if all log-likelihood ratio (LLR) values, used in computing the first message, are guaranteed to have the same magnitude; and
in the event it is determined that all LLR values are guaranteed to have the same magnitude:
obtaining a stored magnitude associated with the same magnitude which all LLR values are guaranteed to have; and
calculating the first message, including by selecting an appropriate sign and using the stored magnitude; and
computing a second message, associated with going from one of the plurality of check nodes to one of the plurality of variable nodes, wherein the scaling constant is not used to compute the second message.

12. The computer program product of claim 11 further comprising computer instructions for:
computing a codeword; and
determining if decoding is successful based at least in part on the codeword and a parity check matrix, wherein in the event it is determined that decoding is successful, the codeword is output.

13. The computer program product of claim 11 further comprising computer instructions for:
generating one or more read thresholds associated with reading solid state storage; and
generating a plurality of log-likelihood ratio (LLR) values, wherein the computer instructions for computing the first message further include computer instructions for computing the first message based on at least one of the plurality of LLR values.

* * * * *